United States Patent
Zwadlo et al.

(10) Patent No.: US 8,198,012 B2
(45) Date of Patent: *Jun. 12, 2012

(54) METHOD OF USING MASK FILM TO FORM RELIEF IMAGES

(75) Inventors: Gregory L. Zwadlo, River Falls, WI (US); David E. Brown, St. Paul, MN (US); Elsie A. Fohrenkamm, St. Paul, MN (US); A. Peter Stolt, Edina, MN (US)

(73) Assignee: Eastman Kodak Company, Rochester, NY (US)

( * ) Notice: Subject to any disclaimer, the term of this patent is extended or adjusted under 35 U.S.C. 154(b) by 112 days.

This patent is subject to a terminal disclaimer.

(21) Appl. No.: 12/722,572

(22) Filed: Mar. 12, 2010

(65) Prior Publication Data

US 2010/0167209 A1  Jul. 1, 2010

Related U.S. Application Data

(62) Division of application No. 11/758,042, filed on Jun. 5, 2007, now Pat. No. 7,799,504.

(51) Int. Cl.
*G03F 7/00* (2006.01)
*G03F 7/26* (2006.01)
(52) U.S. Cl. ....... 430/306; 430/14; 430/253; 430/273.1; 430/309; 430/944
(58) Field of Classification Search .......... 430/253, 430/306, 311
See application file for complete search history.

(56) References Cited

U.S. PATENT DOCUMENTS

| 2,481,770 | A | 9/1949 | Nadeau |
| 5,171,650 | A | 12/1992 | Ellis et al. |
| 5,176,972 | A | 1/1993 | Bloom et al. |
| 5,496,685 | A | 3/1996 | Farber et al. |
| 5,776,661 | A * | 7/1998 | Casaletto et al. ............. 430/306 |
| 6,259,465 | B1 | 7/2001 | Tutt et al. |
| 6,864,039 | B2 | 3/2005 | Cheng et al. |
| 2005/0153117 | A1* | 7/2005 | Suzuki et al. ................. 428/212 |
| 2005/0227182 | A1* | 10/2005 | Ali et al. ...................... 430/311 |

FOREIGN PATENT DOCUMENTS

| EP | 0 504 824 A1 | 9/1992 |
| GB | 627719 | 8/1949 |
| JP | 8-72392 | 3/1996 |

OTHER PUBLICATIONS

JP Abstract 08072392, Tani Yoshio, Published Mar. 19, 1996.

* cited by examiner

*Primary Examiner* — Cynthia Kelly
*Assistant Examiner* — Chanceity Robinson
(74) *Attorney, Agent, or Firm* — J. Lanny Tucker (57) ABSTRACT

A mask-forming film has a transparent layer between the imageable layer and the carrier sheet, which transparent layer has a refractive index that is lower (by at least 0.04) than that of the carrier sheet or any immediately adjacent layer between it and the carrier sheet. This lower refractive index layer modifies the path of incident radiation during mask image transfer so as to provide steeper shoulder angles in the relief image solid areas. This mask film is used to form a relief image such as in a flexographic printing plate.

16 Claims, 2 Drawing Sheets

METHOD OF USING MASK FILM TO FORM RELIEF IMAGES

CROSS-REFERENCE TO RELATED APPLICATION

This is a Divisional of application Ser. No. 11/758,042, filed Jun. 5, 2007 now U.S. Pat. No. 7,799,504.

FIELD OF THE INVENTION

This invention relates to a film or element in which a mask image can be formed that then can be used to form an imaged element bearing a relief image. In particular, this invention relates to mask-forming films that are readily useful for preparing flexographic printing plates, and to methods of making such plates.

BACKGROUND OF THE INVENTION

Radiation-sensitive elements having a laser-ablatable mask layer on the surface are known in the art. A relief image can be produced in such elements without the use of a digital negative image or other imaged element or masking device. Films with a laser-ablatable mask layer can be formed by first imagewise exposing the film with laser radiation (generally an infrared radiation laser under computer control) to selectively remove the mask layer in the exposed areas. The masking film is then placed in contact with a radiation-sensitive element and subjected to overall exposure with actinic radiation (for example, UV radiation) to cure the radiation sensitive element in the unmasked areas and thus form a negative image of the mask in the element. The film containing the mask layer and the imaged radiation-sensitive element (such as an imaged printing plate precursor) are then subjected to solvent development. The unexposed printing plate areas and the mask layer are completely developed off, and after drying, the resulting imaged element is useful, for example as a flexographic printing plate.

While flexographic printing plates having an integral laser-ablatable mask layer allow direct imagewise exposure using a laser and do not require a separate masking device, the time for imaging is generally too long since the system sensitivity to imaging radiation is low. Various attempts have been made in the industry to overcome this problem by increasing the infrared sensitivity of the mask layer. However, obtaining higher sensitivity has been a challenge due to the widely varying quality criteria that must be simultaneously satisfied. In addition, this approach requires the use of high-powered laser-equipped imaging apparatus that is especially configured for imaging flexographic articles. Because of the need for varying the thickness of flexographic plates depending upon the specific intended uses, more than one imaging apparatus may be required for the integral-mask approach.

An important advance in the art of making and using masking films is described in U.S. Patent Application Publication 2005/0227182 (Ali et al., hereinafter cited as US '182). The described method provides a mask image in significantly less time due to greater imaging sensitivity. Problem to be Solved Although the method of relief image formation, as described in US '182 provides a mask image in significantly less time, it has been observed that when UV exposure is done through the carrier sheet of the mask film, the resulting shoulder angle is lower than desirable. This results in a higher level of halation of the printed image. The higher level of halation is particularly noticeable at higher impression pressure during printing.

For printing, surface quality and properties of a flexographic printing plate are important attributes. In practice, prolonged exposure time is often necessary in order to hold or fully cure the smaller features such as the high-light dots, for example, 1% to 5% dots (where percent refers to the amount of paper covered with print ink) of high quality print images. However, the over-exposure fills in the reverse lines or shadow areas. Thus, over-exposure results in image quality degradation.

The term "exposure latitude" describes the degree to which a photosensitive element can be over-exposed with only negligible image quality degradation. Exposure latitude can be further defined as the ability to simultaneously image low light throughput features, for example, 1-2% dots, and high light throughput features, for example, 4-mil reverse lines, onto a flexographic plate. Photosensitive flexographic printing plates with larger exposure latitude are desirable as they are more tolerant to the actual exposure time used during front image-wise exposure and are thus easier to use.

Halation in flexographic printing is a well known. U.S. Pat. No. 6,864,039 (Cheng Lap Kin et al.) describes halation caused by scattering of the UV light within non-imaged areas of the photopolymerizable medium. As nearly all heterogeneous photocrosslinkable compositions exhibit some degree of light scattering, prolonged image-wise exposure leads to a high level of background scattered actinic radiation, which is often sufficient to cause cross-linking or curing of polymer in regions not exposed to imagewise radiation. The overall effect of such unwanted cross-linking is the filling-in of fine negative that is "halos", around solid image areas. Halos lead to degradation in the print quality of flexographic printing plates and are linked to dot-gain that is the formation of a larger image dot size than intended. This patent discloses the use of photobleachable compounds in the photopolymer composition to increase resistance to scattered light.

U.S. Pat. No. 5,496,685 (Farber et al.) also describes halation caused by excessive scattering or irregular reflection of light from the support of the printing element, resulting in shallow relief. It also teaches the use of an actinic radiation absorber to improve exposure latitude.

EP 0 504 824A (Swatton et al.) describes the use of antihalation agents in the support of the photopolymer. The antihalation agents are actinic radiation absorbers.

Another cause of halation is the presence of low-angle-of incidence radiation during exposure that can enter the photopolymer below the mask at the edges of exposed areas, reducing the shoulder angles. As the average shoulder angle decreases below 50°, the loss in the relief sharpness becomes increasingly noticeable and as the average shoulder angle decreases below 40° there is a considerable loss in print stability and sharpness. A collimated light source may reduce the halation by reducing the level of lower angle incident light. However, a collimated light source is more expensive to use than commonly used point light or bank light source.

Adding a low refractive index antihalation layer to photographic silver halide films to control unwanted incident or scattered light is described in U.S. Pat. No. 2,481,770 (Nadeau). But the use of such layers in masking films to provide flexographic printing plates is unknown. There is a need to solve the problem caused by lower angle incident radiation in the preparation of relief images in imageable elements such as flexographic printing plate precursors so the relief image predominantly has shoulder angles of at least 50°. There is also a need to improve exposure latitude so that small dots can be retained on a plate without degrading the shadow images and reverse lines.

SUMMARY OF THE INVENTION

To address these problems, the present invention provides a film comprising a transparent carrier sheet and having thereon at least one non-silver halide thermally sensitive imageable layer and a colorant disposed in the imageable layer or in a different layer between the imageable layer and the carrier sheet, an infrared radiation absorbing compound dispersed in a polymeric binder, and the film further comprising a transparent layer disposed between the carrier sheet and the imageable layer and between the carrier sheet and the layer containing the colorant, which transparent layer has a refractive index lower than the refractive index of the carrier sheet or the refractive index of any optional immediately adjacent layer between the carrier sheet and the transparent layer.

This invention also provides a method of making a relief image comprising:

A) forming a mask image by forming exposed and non-exposed regions in an imaged film, which film prior to imaging, comprises:

a transparent carrier sheet having thereon at least one non-silver halide thermally sensitive imageable layer and a colorant disposed in the imageable layer or in a different layer between the carrier sheet and the imageable layer, an infrared radiation absorbing compound dispersed in a polymeric binder, and a transparent layer disposed between the carrier sheet and the imageable layer, which transparent layer has a refractive index lower than the refractive index of the carrier sheet or the refractive index of any optional immediately adjacent layer between the carrier sheet and the transparent layer, B) transferring (for example, by laminating) the mask image in the imaged film to a radiation-sensitive element while there is complete optical contact between the mask image and the radiation-sensitive element, C) exposing the radiation-sensitive element to curing radiation through the carrier sheet and the mask image to form an imaged element, wherein the mask image is opaque to the curing radiation, and D) developing the imaged element to form a relief image.

In some embodiments, a method of making a relief image uses a film of this invention that comprises on the carrier sheet, in order:

a) the transparent layer comprising a fluoroelastomer and having a thickness of from about 0.2 to about 10 µm, the transparent layer optionally including an adhesion promoter, b) an intermediate layer comprising a poly(vinyl alcohol) and having a thickness of from about 0.2 to about 10 µm, and optionally including an adhesion promoter, c) a barrier layer comprising a poly(cyanoacrylate) and an infrared radiation absorbing dye, d) the imageable layer comprising an infrared radiation absorbing dye and a UV-absorbing colorant dispersed in a binder, and e) an overcoat layer, comprising a methacrylic acid copolymer and fluoropolymer particles, the transparent layer having a refractive index at least 0.04 lower than the refractive index of the carrier sheet.

The present invention provides an improved mask-forming film and method of using it to provide imaged radiation-sensitive elements (such as flexographic printing plates) with improved relief images that predominantly have shoulder angles of at least 50° while holding desired small dot features in halftone areas and maintaining good reverse line depth.

When the imaged film (masking film) is used to form a relief image in a radiation-sensitive element, the imaged film is placed into intimate or complete optical contact with the element in such a manner as to eliminate any air, void space, or gap at the interface (thus, an "air-free" interface). Such a gap may be under vacuum so that air is lacking, but such a gap under vacuum also would not be considered an "air-free" interface.

The unique film of the present invention also provides a modified path for incident relief-forming radiation at the air-free interface during exposure through the mask so that incident radiation light is properly bent to enter the radiation-sensitive element at a desired angle to provide a steeper shoulder angles or slopes around the edges of imaged areas in the resulting relief image.

The unique film of the present invention is believed to restrict the entry of low-angle-of-incidence radiation into the radiation-sensitive material by the process of total internal reflection at the interface between the high refractive index carrier sheet and the low refractive index transparent layer. The angle of incidence ($\phi_{critical}$) above which total internal reflection occurs is dependent on the difference between the high refractive index carrier sheet and the refractive index of the transparent layer can be calculated by Snell's law and is given explicitly by the relationship $\phi_{critical}=\arc\sin(R_L/R_H)$, wherein $R_L$ is the refractive index of the low-index medium and $R_H$ is that of the high-index medium.

These improvements are achieved by incorporating a transparent layer with a lower refractive index in the film of this invention between its imageable layer and the carrier sheet. The incorporated transparent layer has a lower refractive index than the carrier sheet or any optional immediately adjacent layer that is in direct contact with the transparent layer on its carrier sheet side.

DETAILED DESCRIPTION OF THE INVENTION

Definitions

Unless otherwise indicated, the "film" described herein is an embodiment of the present invention. The film may also be known as a "mask element", "mask film", or "masking element". Upon imaging, the film may be known as a "mask", "imaged film", or "imaged masking film" and contains a "mask image".

Unless otherwise indicated, percentages are by weight.

The term "radiation-sensitive element" used herein includes any imageable element or material in which a relief image can be produced by exposure through the imaged masking film. Examples of radiation-sensitive elements include, but are not limited, to flexographic printing plate precursors, printed circuit boards, and lithographic printing plate precursors.

By "ablative", we mean that the imageable layer of the film can be imaged using a thermal ablating means such as laser radiation that causes rapid local changes in the imageable layer thereby causing the material(s) in the imageable layer to be ejected from the layer. This is distinguishable from other material transfer or imaging techniques in that a chemical change rather than a physical change (for example, melting, evaporation, or sublimation) is the predominant mechanism of imaging.

By "optical contact" we mean that two layers or two elements (as in the case of the imaged masking film and a radiation-sensitive element) are in intimate contact so that there is essentially no air-gap or void between the contacted surfaces, thus providing an "air-free interface". More precisely, two surfaces are defined as being in optical contact when the reflection and transmission characteristics of their interface are essentially fully described by the Fresnel laws for the reflection and transmission of light at the refractive-index boundary.

Figure 4:
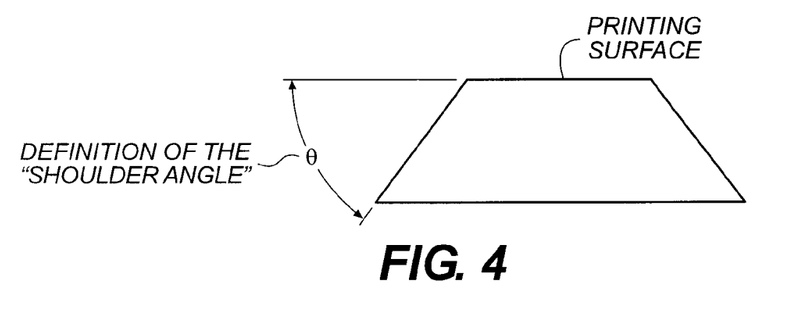
FIG. 4 is a schematic diagram illustrating the definition of "shoulder angle" (θ) for this invention.

"Shoulder angle" is the angle defined by the flat printing surface and the slope of the edge of the raised area, as illustrated for example, in FIG. 4. A "predominant shoulder angle of at least 50°" means that within a given area of the relief image, the average shoulder angle of solid edges is at least 50° and preferably at least 55°. By "average shoulder angle" we mean the average angle of slope of the edge-wall down to a depth of 100 micrometers from the printing surface.

Film:

The film of this invention is used to form a mask image used eventually to form a relief image. This film comprises two or more layers, including one or more imageable layers and a transparent (low refractive index) layer disposed on a transparent carrier sheet. The film may include one or more other layers including one or more of a barrier layer, intermediate or intermediate layer, adhesive layer, or other layers generally used in the art in masking films according to US '182 noted above. Different constructions of the film may be used in one or more different imaging methods.

Carrier Sheet:

The carrier sheet may be any suitable transparent substrate. Useful carrier sheets include but not limited to, transparent polymeric films and sheets such as polyesters including poly (ethylene terephthalate), poly(ethylene naphthalate), and fluorine polyester polymers, polyethylene, polypropylene, polybutadienes, polycarbonates, polyacrylates, polyvinyl chloride and copolymers thereof, and hydrolyzed and non-hydrolyzed cellulose acetate. Generally, the carrier sheet is from about 20 to about 200 μm thick. For example, a transparent poly(ethylene terephthalate) sheet sold under the name of MELINEX by DuPont Teijin Films (Hopewell, Va.) is suitable for this purpose.

If necessary, the carrier sheet surface can be treated to modify its wettability and adhesion to applied coatings. Such surface treatments include but are not limited to corona discharge treatment and the application of subbing layers.

In addition, the carrier sheet can contain one or more "adhesion promoters" that improve adhesion between the carrier sheet and the next adjacent layer, whatever type of layer or whatever purpose that layer may have. Useful adhesion promoters include but are not limited to, gelatin, polyvinylidene chloride, poly (acrylonitrile-co-vinylidene chloride-co-acrylic acid), and polyethylenimine.

Transparent Layer:

The transparent layer is generally comprised of one or more film-forming polymeric materials that collectively provide a refractive index that is lower than the refractive index of the carrier sheet (or any optional immediately adjacent layer between the transparent layer and the carrier sheet). This difference in refractive index may be as low as 0.04 and more typically at least 0.08. One skilled in the art can readily determine useful polymeric film-forming materials since there are hundreds of possible materials commercially available. To see if a given material is useful, its refractive index (if not already known from the art or trade literature), can be determined by, for example, precisely measuring the location of the interference maxima in the spectral scan of a thin, uniform film of the material over the required range of wavelengths. This refractive index can then be compared to that of the carrier sheet (or optional intermediate layer) whose refractive index is known in the art or can be determined using a known procedure such as that just described.

By "transparent", we mean that the transparent layer that is generally has a transmission optical density of less than 0.3, and is thus not considered opaque or even translucent. The transparent layer desirably has a refractive index that is at least 0.08 lower than the refractive index of the supporting film base.

Certain classes of film forming polymeric materials that can be used include one or more fluoroelastomers such as those described in U.S. Pat. No. 5,176,972 (Bloom et al.). Such polymers include fluorinated acrylate polymers that are derived from fluorinated acrylate monomers that have the following formula:

wherein n is 1 or 2, R is hydrogen or a methyl group, Y is a perfluoroalkylene group, and T is a fluorine or —$CF_2H$ group (for example, 1H,1H-pentadeca-fluoroocyl acrylate, 1H,1H, 5H-octafluoropentayl acrylate, trifluoroethyl acrylate, and heptafluorobutyl acrylate). The fluorinated monofunctional acrylate monomer may also contain heteroatoms such as oxygen, sulfur, and nitrogen atoms, for example having the following formula:

wherein Z is $H(CF_2)_m$ or $F(CF_2)_m$ wherein m is an integer of from 3 to 12, R is hydrogen or a methyl group, and R' is an alkyl group.

Such monomers or polymers derived therefrom can be obtained from a number of commercial sources including 3M Corporation (St. Paul, Minn.).

Other useful fluoroelastomers include fluoroolefins such as copolymers of vinylidene fluoride and hexafluoropropylene, terpolymers of vinylidene fluoride, hexafluoropropylene, and tetrafluoroethylene, mixtures of two or more of such polymers, or blend of such copolymers or terpolymers with polytetrafluoroethylene (PTFE) that can be provided as a latex. Some of these fluoroelastomers can be obtained from 3M Corporation, or they can be prepared by copolymerization of known monomers using known conditions as described for example in U.S. Pat. No. 5,176,972 (noted above). One specific copolymer of this type is available from 3M Corporation as Fluorel FC-2175.

Alternatively, the transparent layer can be composed of film-forming polymeric materials that do not of themselves have the desired refractive index, but various non-film-forming materials such as matting agents, fillers, microcapsules, or a salt, can be dispersed in the film-forming materials that act as binders, to provide the desired refractive index. Examples of such dispersed additives, are described in U.S. Pat. No. 2,481,700 (Kuan-han Sun et al.) that include but are not limited to, NaBF$_4$ and NH$_4$BF$_4$ dispersed in poly(vinyl alcohol), and MgSiF$_6$ dispersed in a suitable binder.

The transparent layer generally has a substantially uniform thickness of at least 0.25 µm and typically from about 0.4 to about 10 µm. It is generally provided as a substantially uniform coating with little variation in thickness over its entire area.

The transparent layer can also contain adhesion promoters in addition to or alternative to the carrier sheet. Examples of useful adhesion promoters are polyethylenimine, poly(vinylidene chloride), and similar copolymers, and Fusabond (sold by Dupont). Adhesion promoters are chosen such that they are soluble in the coating solvent for the low refractive index material.

Imageable Layer(s):

The imageable layer(s) are generally disposed on the transparent layer as relatively uniform coatings (that is, being substantially continuous and having fairly uniform thickness). In some embodiments, the imageable layer and transparent layer underneath it are the only layers on the carrier sheet. In other embodiments, there are multiple layers including multiple imaging layers or an imageable layer with a barrier layer, intermediate, or other layer(s) as described below.

The components of the imageable layer(s) are chosen to be soluble or swellable in suitable flexographic printing plate developers including both chlorinated organic solvents and the non-chlorinated organic solvents described below that are used to create the relief image after exposure of the radiation-sensitive element to curable radiation through the imaged masking film.

The imageable layer(s) generally includes one or more "colorants" or substances that may or may not impart visible color based on total solids of the layer. The colorant is generally capable of strong absorbance of the curing radiation or is otherwise capable of blocking curing radiation. As used herein, "colorant" indicates a component that substantially prevents the transmission of curing radiation through the mask image.

The colorant may be one or more dyes or pigments, or mixtures thereof that will provide desired spectral properties. It can be a particulate material that is dispersed within the polymeric binder(s) described below. For example, they can be black dyes or pigments such as carbon black, metal oxides, and other materials described for example in US '182 (noted above), that is incorporated herein in its entirety. It is useful that the pigments or dyes be substantially non-IR absorbing so that imaging of the radiation-sensitive element is not adversely affected. For example, the colorant can absorb UV or visible radiation, and in many embodiments, the colorant is an UV-absorbing dye.

In one embodiment, the colorant is a black dye or pigment that absorbs energy at substantially all wavelengths across the visible spectrum, for example from about 350 to about 750 nm. The black dye or pigment may be a mixture of dyes or pigments, or mixtures of both dyes and pigments that individually may or may not be black but when mixed together provide a neutral black color. For example, a mixture of NEPTUN Black, Blue Shade Magenta, and Red Shade Yellow pigment (available from BASF in Germany) that provide a neutral black color may be used. DISPERSAL CBJ (from Runnemade Dispersions KV of the UK) may also be suitable.

One suitable black pigment is carbon black of which there are numerous types with various particles sizes that are commercially available. Examples include RAVEN 450, 760 ULTRA, 890, 1020, 1250 and others that are available from Columbian Chemicals Co. (Atlanta, Ga.) as well as BLACK PEARLS 170, BLACK PEARLS 480, VULCAN XC72, BLACK PEARLS 1100 and others available from Cabot Corp. (Walthan, Mass.).

The colorant(s) can be present in the imageable layer in an amount of from about 10 to about 50 weight %, and typically from about 10 to about 40 weight %.

It may be desirable to combine the use of carbon black with a non-infrared absorbing black dye or pigment to reduce interference with the radiation and improve the quality of the resulting imaged masking film. Also suitable as a pigment is a non-carbonaceous particulate material such as metal particles or metal oxide particles.

The imageable layer(s) generally also includes one or more infrared radiation absorbing compounds. In some embodiments, the colorant acts in this function also but in other embodiments, a separate compound is included for this purpose, that is, to sensitize the imageable layer(s) to imaging IR radiation. Thus, the infrared radiation absorbing compound is sensitive to radiation in the range of from about 700 to about 1500 nm and typically from about 700 to about 1200 nm. Examples of useful IR absorbing compounds include but are not limited to, cyanine infrared radiation (IR) absorbing dyes, carbon blacks, and metals such as aluminum. In one embodiment, a mixture of IR dyes is used, which IR dyes can absorb at different wavelengths, for example at 830 nm and 1064 nm.

Examples of suitable IR dyes include but are not limited to, azo dyes, squarilium dyes, croconate dyes, triarylamine dyes, thiazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,569,603 (Furukawa), and U.S. Pat. No. 6,787,281 (Tao et al.), and EP Publication 1,182,033 (Fijimaki et al.). A general description of one class of suitable cyanine dyes is shown by the formula in paragraph [0026] of WO 2004/101280, incorporated herein by reference.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks, some of which are surface-functionalized with solubilizing groups are well known in the art. Carbon blacks that are grafted to hydrophilic, nonionic polymers, such as FX-GE- 003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound (for example IR-absorbing compound) is generally present in an amount to provide a transmission optical density of at least 0.5 and typically of at least 0.75 at the exposing wavelength. Generally, this is achieved by including from about 1 to about 20 weight % of the one or more compounds, based on the solids content of the imageable layer. For example, the IR absorbing compound should be sufficient to produce transparent areas where the film is exposed to infrared radiation, meaning that such areas would have a transmission optical density of about 0.5 or less as measured using a suitable filter on a conventional densitometer.

In other embodiments, the radiation absorbing compound may include an ultraviolet absorber that absorbs radiation at from about 150 to about 400 nm. The UV absorber can be used as the only radiation absorbing compound or in combination with an IR absorber compound.

The imageable layer can optionally include a fluorocarbon additive for enhancing transfer of a molten or softened film and production of halftone dots (that is, pixels) having well-defined, generally continuous, and relatively sharp edges. Examples of useful fluorocarbon additives and amounts are provided in [0087] to [0089] of US '182 (noted above).

Additional optional components of the imageable layer(s) include but are not limited to, plasticizers, coating aids or surfactants, dispersing aids, UV absorbers, and fillers, all of which are well known in the art as described for example in [0094] to [0096] of US '182 (noted above).

All of the components described above for the imageable layer(s) are dispersed in one or more polymeric binders (both synthetic and naturally occurring polymeric materials) that are capable of dissolving or dispersing the other components in the imageable layer. The one or more polymeric binders are generally present in an amount of from about 25 to about 75 weight %, and typically from about 35 to about 65 weight %, based on the total dry weight of the imageable layer.

While a wide variety of polymeric binders can be used, some advantages can be achieved by using certain "primary" polymeric binders in an amount of at least 50 weight %, and typically at least 70 weight % and up to 100 weight %, of the total polymeric binder weight. The useful polymeric binders are those into which various components can be incorporated and that are soluble in suitable coating solvents such as lower alcohols, ketones, ethers, hydrocarbons, and haloalkanes. The polymeric binders are also desirably soluble or swellable in the chosen developer (described below).

Polymeric Binders:

Useful polymeric binders include the materials described for example in [0081] to [0085] of US '182, which paragraphs are incorporated herein by reference. The polymeric binders may be known as "adhesive binders" as described for example in [0081] of US '182 (noted above). Examples of suitable adhesive binders include but are not limited to, acetyl polymers such as poly(vinyl butyral)s that can be obtained for example as BUTVAR® B-76 from Solution, Inc. (St. Louis, Mo.) and acrylamide polymers that can be obtained as MAC-ROMELT 6900 from Henkel Corp. (Gulph Mills, Pa.). Pressure-sensitive adhesive polymers may also be used for this purpose.

In some embodiment, where the colorant layer is ablatable, it is advantageous to use binders that are easily thermally combustible, and generates gases and volatile fragments at temperature less than 200° C. Examples of these binders are nitrocellulose, polycarbonates, polyurethanes, polyesters, polyorthoesters, polyacetals, and copolymers thereof (see U.S. Pat. No. 5,171,650 of Ellis et al., Col. 9, lines 41-50).

Other useful secondary polymeric binders are resins having hydroxyl groups (or hydroxylic polymers) as described in [0082] to [0084] of US '182 (noted above) and include for example poly(vinyl alcohol)s and cellulosic polymers (such as nitrocellulose). Still further secondary polymeric binders are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms.

Some other useful polymeric binders that have been found to be readily dissolved or dispersed in non-chlorinated organic solvents are described below. They may also be dissolvable or dispersible in chlorinated organic solvents also. Such useful classes of polymeric binders that meet these characteristics include but are not limited to, terpene resins, phenolic resins, aromatic hydrocarbon resins, polyurethanes (including polyether polyurethanes), long-chain acrylate and methacrylate resins. Useful terpene resins include but are not limited to the SYLVARES terpene resins such as SYLVARES TR-A25 terpene resin that is available from Arizona Chemical Co. (Jacksonville, Fla.). Useful phenolic resins include but are not limited to, novolac resins such as CK2500 and CK2400 novolac resins that are available from Georgia Pacific Resins (Atlanta, Ga.). Aromatic hydrocarbon resins include but are not limited to, NORSOLENE® resins such as NORSOLENE® S-155 resin that are available from Sartomer Co. (Warrington, Pa.). Useful polyurethanes include but are not limited to, SURKOPAK® 5245 and SURKOFILM® 72S polyurethane resins that are available from Tennants Inks & Coatings Supplies, Ltd. (Surrey, UK) and NeoRez 322 polyurethane resin that is available from DSM NeoResins (Wilmington, Mass.). Long chain acrylate and methacrylate resins include those vinyl polymers derived from one or more long chain acrylate or methacrylate monomers wherein the long alkyl chain has at least 3 carbon atoms. Such monomers include but are not limited to, iso-butyl methacrylate, n-butyl methacrylate, and mixtures thereof Useful polymeric binders are homopolymers and copolymers derived from at least iso-butyl methacrylate, n-butyl methacrylate, or mixtures thereof. Commercially available primary polymeric materials of this type include ELVACITE® 2045 and ELVACITE® 2046 polymers that are available from Lucite International (Cordova, Tenn.). For example, it was found that the commercial polymers available as SURKOPAK® 5245 polyurethane resin and SURKO-FILM® 72S polyurethane resin, ELVACITE® 2045 polymeric material, and CK 2500 novolac resin are useful.

The imageable layer can further include plasticizers, coating aids, dispersing agents, UV absorbers, fillers, surfactants, fluorocarbons, and other additives as described in US '182 (noted above). Adhesion promoters, such as those described above for the carrier sheet, can also be included.

Intermediate Layer:

In some embodiments of this invention, the film can include an "intermediate layer" disposed between the carrier sheet and the imageable layer(s). In some instances, the intermediate layer is directly disposed on the carrier sheet and between it and the transparent layer described above. In other embodiments, the intermediate layer is directly disposed onto the transparent layer and is between it and the imageable layer. The presence of an intermediate layer may be desirable to facilitate the transfer of a resulting mask image to the radiation-sensitive element. Generally, the intermediate layer is developable, dispersible, or easily removable after curing through the mask image or during subsequent processing (development) of the imaged element. Furthermore, the intermediate layer usually does not significantly absorb or scatter the curing radiation. For example, it usually does not include matte agents or other light scattering materials. If a coating solvent is used to coat the intermediate layer, the coating solvent is chosen such that during coating there is little intermixing between the transparent layer and the intermediate layer.

Representative coatings suitable for use as an intermediate layer include but are not limited to poly(vinyl alcohols) or similar polymers, cellulosic polymers such as methyl cellulose or hydroxypropyl methyl cellulose, poly(vinyl butyral), or hydrolyzed styrene maleic anhydride. In this invention, UV exposure is carried out through the carrier sheet so that the carrier sheet prevents oxygen migration.

The intermediate layer may be relatively thin and have a dry thickness of from about 0.1 to 10 μm.

In other embodiments, the intermediate layer is a thermally resistant polymer layer that has desired layer integrity and good release properties after thermal imaging. Thermally resistant polymers include but are not limited to, polyimides, polysulfones, polyether ethyl ketone, bisphenol-A terephthalate, poly(vinyl alcohols), and polyamides, and can be optimized to provide desirable release properties, curability, and developability.

The intermediate layer may also include crosslinking agents to improve release properties, coating aids, surfactants, and release-enhancing agents. Further details of useful intermediate layer compositions are provided in US '182 (noted above).

Barrier Layer:

The film of this invention can also include a barrier layer disposed between the transparent layer or intermediate layer (if present) and the imageable layer(s) that may be used to prevent colorant migration into or thermal damage to the transparent or intermediate layers during the ablation process. In most embodiments, the barrier layer is disposed over the intermediate layer and under an imageable layer. Suitable barrier layers and their compositions are also described in US '182 (noted above) and references cited therein. For example, the barrier layer may include one or more polymer binders, particularly, "heat-combustible" polymer binders such as poly(alkyl cyanoacrylate)s and nitrocellulose, and particulate materials such as metal oxide particles (for example, iron oxide particles) to provide high optical density with respect to imaging or curing radiation. Metal oxide particles may be useful for ablative imaging because they can thermally decompose to generate propulsive gases.

The barrier layer may optionally include an infrared absorbing compound, such as infrared absorbing dyes (IR dyes) including cationic infrared-absorbing dyes and photothermal-bleachable dyes, and crosslinking agents such as melamine-formaldehyde resins, dialdehydes, phenolics, polyfunctional aziridines, isocyanates, and urea-formaldehyde epoxies to provide greater thermal resistance.

Other Film Components:

An adhesive layer can be present in the film overlying the imageable layer(s) to enhance adhesion of the mask image to the radiation-sensitive element during transfer and to aid in the transfer of the mask image. The adhesive layer may comprise a thermoplastic, thermal adhesive, or pressure-sensitive adhesive that is well known in the art.

In some embodiments the adhesive layer, or also used as an overcoat layer, may comprise a methacrylic acid copolymer (such as a copolymer of ethyl methacrylate and methacrylic acid) and particles of one or more fluoropolymers dispersed therein as described, for example, in Example 1 (top particle layer) in U.S. Pat. No. 6,259,465 (Tutt et al.). The overcoat layer may also provide abrasion resistance to handling due to the presence of the particulates. The overcoat layer may also act as a dye barrier layer to prevent dye migration from the masking film to the photopolymer after lamination.

Thus, in some embodiments of this invention, the film comprises a carrier sheet, having disposed thereon, in order:
a) a transparent layer as described above,
b) an intermediate layer as described above,
c) a barrier layer as described above,
d) an imageable layer as described above, and
e) an overcoat as described above, wherein the transparent layer has a refractive index at least 0.08 lower than the refractive index of the carrier sheet.

Radiation-Sensitive Elements

Considerable details of useful radiation-sensitive elements such as flexographic printing plate precursors, printed circuit boards, and lithographic printing plates are provided in US '182 (noted above). Such elements include a suitable dimensionally stable substrate, at least one radiation-sensitive layer, and optionally a separation layer, cover sheet, or metal layer. Suitable substrates include dimensionally stable polymeric films and aluminum sheets. Polyester films are preferred. Any radiation-sensitive element that is capable of producing a relief image using the film described herein is useful in the practice of this invention.

The radiation-sensitive element can be positive- or negative-working, but typically, it is negative-working and generally includes a visible- or UV-sensitive imageable layer containing a visible-radiation or UV-radiation curable composition that is cured or hardened by polymerization or crosslinking upon exposure to the curing radiation. For example, the radiation-sensitive element can be UV-sensitive. Many details of various components of the radiation-sensitive elements are provided in US '182 (noted above), and references cited therein.

Some embodiments also include a removable cover sheet as well as a separation layer, or sometimes referred to as anti-tack layer, that helps removal of the cover sheet and protects the radiation-sensitive imageable layer from fingerprints and other damage and that is disposed between the radiation-sensitive imageable layer and the cover sheet. Useful separation layer materials include but are not limited to, polyamides, poly(vinyl alcohols), copolymers of ethylene and vinyl acetate, amphoteric interpolymers, cellulosic polymers, poly(vinyl butyral), cyclic rubbers, and combinations thereof.

The radiation-sensitive imageable layer can include an elastomeric binder, at least one monomer, and an initiator that is sensitive to non-IR radiation. In most cases, the initiator will be sensitive to UV or visible radiation. Suitable initiator compositions include but are not limited to those described in U.S. Pat. No. 4,323,637 (Chen et al.), U.S. Pat. No. 4,427,749 (Gruetzmacher et al.), and U.S. Pat. No. 4,894,315 (Feinberg et al.).

The elastomeric binder can be a single or mixture of polymers that may be soluble, swellable, or dispersible in aqueous, semi-aqueous, or organic solvent developers and include but are not limited to, binders that are soluble, swellable, or dispersible in organic solvents such as natural or synthetic polymers of conjugated diolefins, block copolymers, core-shell microgels, and blends of microgels and preformed macromolecular polymers. The elastomeric binder can comprise at least 65% of the imageable layer based on total layer solids. More details of such elastomeric binders are provided in [0190] of US '182 (noted above) and references cited therein.

The imageable layer can also include a single monomer or mixture of monomers that must be compatible with the elastomeric binder to the extent that a clear, non-cloudy radiation-sensitive layer is produced. Monomers for this purpose are well known the art and include ethylenically unsaturated polymerizable compounds having relatively low molecular weight (generally less than 30,000 Daltons). Examples of suitable monomers include various mono- and polyacrylates, acrylate derivatives of isocyanates, esters, and epoxides. Specific monomers are described in [0191] of US '182 (noted above) and in references cited therein.

The photoinitiator may be a single compound or combination of compounds that are sensitive to visible or UV radiation and that generate free radicals that initiate the polymerization of the monomer(s) without excessive termination and are generally present in an amount of from about 0.001 to about 10% based on the total dry weight of the imageable layer. Examples of suitable initiators include substituted or unsubstituted polynuclear quinines and further details are provided in [0192] of US '182 (noted above) and in references cited therein.

The radiation-sensitive layer can include other addenda that provide various properties including but not limited to sensitizers, plasticizers, rheology modifiers, thermal polymerization inhibitors, tackifiers, colorants, antioxidants, antiozonants, and fillers.

The thickness of the radiation-sensitive imageable layer may vary depending upon the type of imaged plate desired. In some embodiments, a UV-sensitive imageable layer may be from about 500 to about 6400 μm in thickness.

In one embodiment, the radiation-sensitive element is a flexographic printing plate precursor that includes a suitable UV-curable resin and when exposed and processed, provides a flexographic printing plate. Such elements generally include a suitable substrate, one or more UV-sensitive imageable layers comprising a photosensitive material that include a polymer or prepolymer. Examples of commercially available flexographic printing plate precursors include but are not limited to, FLEXCEL flexographic elements available from Kodak Polychrome Graphics, a subsidiary of Eastman Kodak Company (Norwalk, Conn.), CYREL® Flexographic plates available from DuPont (Wilmington, Del.), NYLOFLEX® FAR 284 plates available from BASF (Germany), FLEXILIGHT CBU plate available from Macdermid (Denver, Colo.), and ASAHI AFP XDI available from Asahi Kasei (Japan).

The radiation-sensitive element may also be used to form printed circuit board wherein a conducting layer (also known as a "printing circuit) is formed on a substrate in the pattern dictated by the mask image. Suitable precursors to printed circuit boards generally comprise a substrate, a metal layer, and a photosensitive layer. Suitable substrates include polyimide films, glass-filled epoxy or phenol-formaldehyde or any other insulating materials known in the art. The metal layer covering the substrate is generally a conductive metal such as copper or an alloy or metals. The photosensitive layer may include an UV-curable resin, monomers, or oligomers, photoinitiators, and a binder. The photosensitive layer in the printed circuit board precursor may be a positive- or negative-working layer. Further details of printed circuit boards are provided in [0196] to [0205] of US '182 (noted above)

Forming a Mask Image:

In the practice of this invention, a mask image is formed by producing exposed and non-exposed regions in the film of this invention. The choice of imaging mechanism will determine the possible variations in forming the mask image, as described below.

Exposing the film can be carried out in selected regions, otherwise known as "imagewise exposure". Both analog and digital methods can be used for imagewise exposure and are conventional in the art. In some embodiments, imagewise exposure can be accomplished using laser radiation from a laser that is scanned or rasterized under computer control. Any of the known scanning devices can be used including flat-bed scanners, external drum scanners, and internal drum scanners. In these devices, the film is secured to the drum or bed, and the laser beam is focused to a spot that can impinge on the film. Two or more lasers may scan different regions of the film simultaneously.

For example, the film can be exposed to infrared radiation, for example, in the range of from about 700 to about 1400 nm. Such films contain one or more infrared radiation absorbing compounds as described above to provide sensitivity to infrared radiation. In these embodiments, the film may be suitably mounted to an infrared imager and exposed to the infrared radiation using an infrared laser such as a diode laser or Nd:YAG laser that may be scanned under computer control. Suitable infrared imagers include but are not limited to DESERTCAT 88 imagers available from ECRM (Tewksbury, Mass.) used in color proofing, TRENDSETTER imagesetters and ThermoFlex Flexographic CTP imagers available from Eastman Kodak Company (Burnaby, British Columbia, Canada) used for CTP lithographic plate applications and for imaging flexographic elements, DIMENSION imagesetters available from Presstek (Hudson, N.H.) useful for CTP lithographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

In other embodiments, the film is exposed to visible laser light, for example in the range of from about 400 to about 750 nm. Commercially available filmsetters and imagesetters can be used including but not limited to, ACCUSET Plus imagesetter (visible red laser diode, 670 nm) and ADVANTAGE DL3850 imagesetter (410 nm), SELECTSET 5000 imagesetter (HeNe, 630 nm), all available from Agfa-Gevaert (Belgium), LUXEL V-9600 (410 nm) available from Fuji Photo Film (Japan), and DIAMONDSETTER imagesetter (frequency-doubled Nd-YAG laser, 532 nm) available from Western Lithotech (St. Louis, Mo.).

In still other embodiments, the film can be exposed to ultraviolet radiation by laser direct imaging in the range of from about 150 to about 410 nm. Apparatus useful for such imaging include but are not limited to, DP-100 imagers available from Orbotech (Billerica, Mass.) and DIGIRITE 2000 imager available from Etec Systems (Tucson, Ariz.).

The step of forming the mask image may also include a step of removing either exposed or non-exposed regions of imageable layer. In some embodiments, the exposed regions are removed, leaving a mask image on the transparent carrier sheet (and transparent layer disposed thereon). For these embodiments, a receptor sheet may optionally be used for removal of unwanted portions of the imageable layer. Such a receptor sheet may be any suitable paper, transparent film, or metal sheet to which one or more coatings have been applied before irradiation of the films to facilitate transfer of the imageable layer to the receptor. After imaging, the receptor sheet may be removed from the film to reveal the mask image on the carrier sheet. A complementary image to the mask image may remain on the receptor sheet.

In other embodiments, a mask image is formed on the carrier sheet (and transparent layer disposed thereon) by producing exposed and non-exposed regions of the imageable layer and other layers, and removing non-exposed regions of those layers.

In some embodiments, the mask image residing on the carrier sheet may be cured by subjecting it to heat treatment, provided that the transfer property of the mask image is not adversely affected. Heat treatment may be done by a variety of means including but not limited to, storage in an oven, hot air treatment, or contact with a heated platen or passage through a heated roller device. Heat treatment is not necessary for curing to take place.

In still other embodiments, a mask image can be formed as noted above and the exposed regions are transferred to a receptor sheet. The receptor sheet it then removed from the imaged masking film before the mask image is transferred to a radiation-sensitive element. Thus, the film may be provided with a receptor sheet in contact with the radiation-sensitive element, or the element is contacted with a separate receptor sheet.

Where a separate receptor sheet is used during imaging, the film and receptor sheet are assembled in close proximity prior to imaging, with the image-receiving side of the receptor sheet adjacent to the imageable layer. The term "close proximity" in this context can mean that the imageable layer and receptor sheet are brought into contact, or that they do not contact each other but are sufficiently close to allow transfer of imageable layer or colorant upon exposure to imaging radiation. Vacuum hold-down or a mechanical means may be used to secure the film and receptor sheet in assembly.

Next, the assembly of the film and receptor sheets is imagewise exposed using imaging radiation to form a mask image, as described below. Imagewise exposure causes imagewise transfer of imageable layer or colorant from the film to the receptor sheet. After imaging, the film may be removed from the receptor sheet to reveal the mask image on the receptor sheet.

Several imaging mechanisms are mentioned briefly below and further details are provided by US '182 (noted above) and references cited therein beginning with paragraphs [0142].

Ablation:

In this mechanism, the exposed regions of the imageable layer are removed from the imaged film by the generation of a gas, leaving a mask image. Specific binders that decompose upon exposure to heat (such as IR laser irradiation) to rapidly generate a gas may be used. This action is to be distinguished from other mass transfer techniques in that a chemical rather than a physical change cases an almost complete transfer of the imageable layer rather than a partial transfer.

Melt-Stick Technique:

The exposed areas of the imageable layer can be transferred in a molten or semi-molten state from the imaged film to a suitable receptor sheet upon exposure to radiation. The exposed areas are characterized by reduced viscosity that provides flowability to the imageable layer that flows across to and adheres to the surface of the receptor sheet with greater strength than it adheres to the carrier sheet (and transparent layer disposed thereon). Following this physical transfer, the carrier sheet, along with the untransferred imageable layer, is separated from the receptor sheet.

In one embodiment, the mask image comprises the non-exposed regions remaining on the carrier sheet. In another embodiment, the mask image comprises the exposed regions of the imageable layer that are transferred to the receptor sheet.

Laser-Induced Film Transfer:

With this imaging mechanism, the exposed regions of the imageable layer are removed from the carrier sheet (and transparent layer disposed thereon) through laser-induced film transfer ("LIFT"). An intermediate layer containing a latent crosslinking agent is disposed between the carrier sheet and the imageable layer. The latent crosslinking agent reacts with the binder to form a high molecular weight network in the exposed regions to provide better control of melt flow phenomena, transfer of more cohesive material to the receptor sheet, and high quality edge sharpness of the mask image.

In one embodiment, the imageable layer includes a transferable colorant and an infrared absorbing dye (IR dye). In another embodiment, the imageable layer includes a transferable colorant, a polymeric binder as described above, a fluorocarbon additive, a cationic IR dye, and latent crosslinking agent as described above.

The mask image can comprise the non-exposed regions of the imageable layer remaining in the imaged film, but in other embodiments, the mask image comprises the exposed regions that are transferred to the receptor sheet.

Peel-Apart:

In this imaging mechanism, the exposed regions of the imageable layer are removed from the carrier sheet (and transparent layer disposed thereon) using a suitable receptor sheet based differential adhesion properties in the imageable layer. After imagewise exposure of the film, the receptor sheet is separated from the carrier sheet and either exposed or non-exposed regions remain in the film.

Dye Sublimation or Diffusion:

In yet another imaging technique, colorant from exposed regions of the imageable layer is removed through sublimation wherein the colorant is diffused or sublimed without simultaneous transfer of the binder. A mask image may be generated in the film without the need for a receptor sheet. In other embodiments, a receptor sheet is used to capture the sublimed colorant. The mask image then comprises the imageable layer remaining in the imaged film. In still other embodiments, the mask image comprises the colorant that is transferred to a receptor sheet.

Alkaline Development of Mask:

The exposed regions of the imageable layer can also be removed by conventional alkaline development when the imaged film is washed with a suitable alkaline developer while non-exposed regions remain on the carrier sheet. The imageable layer is positive-working in this instance and can be composed of any of the known positive-working compositions. The developer has a pH of from about 9 to about 14 and comprises water and generally a hydroxide and other various addenda common to such solutions.

Alternatively, the non-exposed regions of the imageable layer are removed from the imaged film to produce a mask image. Such imageable layer compositions are negative-working and become insoluble in the developer upon exposure. Useful developers for such materials generally have a pH of from about 7 to about 13 and include water-miscible high-boiling organic solvents and various addenda common to such solutions.

Useful developers for these materials are well known and available from several sources including Eastman Kodak Company (Norwalk, Conn.).

Once the mask image has been formed, it is transferred to a suitable radiation-sensitive element (described above) that is sensitive to curing radiation (usually UV radiation). Mask image transfer includes placing the film with the mask image onto the radiation-sensitive element, or a radiation-sensitive composition or layer thereof.

The film and radiation-sensitive element are placed in such contact as to provide an air-free interface. Generally, this is achieved by laminating the film it to the radiation-sensitive element by applying pressure or heat, or both pressure and heat to form an air-free or gap-free interface. Commercially available laminators that provide both heat and pressure may be used including but not limited to, KODAK model 800XL APPROVAL LAMINATOR available from Eastman Kodak Company (Rochester, N.Y.), CODOR LPP650 LAMINATOR available from CODOR (Amsterdam, Holland), and LEDCO HD laminators available from Filmsource (Casselbury, Fla.). A protective cover sheet, if present in the film, is removed before lamination. The assembled film with the mask image and radiation-sensitive element are fed into the laminator at the desired speed, temperature, and pressure. A representative example of this process is shown in the examples below.

In one embodiment, the radiation sensitive element for flexographic applications do not have the separation layer (anti-tack layer), where pressure alone may be sufficient to achieve air-free interface, as the radiation sensitive element is tacky, or acts as a pressure sensitive adhesive, due to the presence of monomers.

In still another embodiment, transfer of the mask image can be achieved by using pressure-sensitive adhesion when the masking film and radiation-sensitive element are pressed into contact with each other to form an air-free interface. A pressure-sensitive adhesive may be incorporated into the radiation-sensitive element, or it may be placed in a separate layer between the imageable layer and the radiation-sensitive element. Suitable pressure-sensitive adhesives are known in the art.

In still another embodiment, the mask image can be transferred using what is known as a "liquid photopolymer process" in which a radiation-sensitive or photopolymer composition is uniformly applied, in liquid or paste form, to the transparent layer of the imaged film containing the mask image, for example, by placing the radiation-sensitive composition between the imaged film and a transparent support material that then becomes the "support" or substrate for the radiation-sensitive element (defined below). For example, the transparent support material can be a polymeric film as described above for the radiation-sensitive elements.

Exposure of Radiation-Sensitive Element

After an air-free contact is made between the mask film and the radiation sensitive element as described above, the radiation-sensitive element is exposed to curing radiation through the film containing the mask image to form an imaged element. In this step, the curing radiation is projected onto the radiation-sensitive element through the mask image that preferentially blocks some of the radiation. In unmasked regions, curing radiation will cause hardening or curing of the radiation-sensitive composition(s). The mask image should therefore be substantially opaque to the exposing radiation, meaning that the mask image should have a transmission optical density of 2 or more and preferably 3 or more. The unmasked regions should be substantially transparent meaning that the unmasked regions of the radiation-sensitive element should have a transmission optical density of 0.5 or less, preferably 0.1 or less, and more preferably 0.05 or less. Transmission optical density can be measured using a suitable filter on a densitometer, for example, a MACBETH TR 927 densitometer.

Generally, exposure of the radiation-sensitive element through the film containing the mask image is accomplished by floodwise exposure from suitable irradiation sources (for example, visible radiation or UV radiation). Exposure can be carried out in the presence of atmospheric oxygen. Exposure under vacuum is not necessary as air-free contact (or optical contact) has already been made.

In the manufacture of a relief printing plate, such as a flexographic printing plate, one side of the radiation-sensitive element is generally first exposed to curing radiation through a transparent support (known as "back exposure") to prepare a thin, uniform cured layer on the support side of the element. The radiation-sensitive element is then exposed to curing radiation through the film containing the mask image, thereby causing the radiation-sensitive composition to harden or cure in the unmasked areas. Unexposed and uncured regions of the radiation-sensitive element are then removed by a developing process (described below), leaving the cured regions that define the relief printing surface. The back exposure could be performed either before or after the air-free contact is made between the mask film and the radiation sensitive element.

The wavelength or range of wavelengths suitable as the curing radiation will be dictated by the nature of the radiation-sensitive element. In some embodiments, the curing radiation is ultraviolet radiation at a wavelength of from about 340 to about 400 nm. Sources of visible or UV radiation for floodwise or overall exposure include but are not limited to, carbon arcs, mercury-vapor arcs, fluorescent lamps, electron flash units, and photographic flood lamps. UV radiation is particularly useful from mercury-vapor lamps and more particularly sun lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (East Chicago, Ind.), and BURGESS EXPOSURE FRAME, Model 5K-3343V511 with ADDALUX 754-18017 lamp available from Burgess Industries, Inc. (Plymouth, Mass.).

Other suitable sources of UV radiation include platemakers that are able to both expose the radiation-sensitive element to radiation and to develop the element after radiation exposure. Examples of suitable platemakers include but are not limited to, KELLEIGH MODEL 310 PLATEMAKER available from Kelleigh Corporation (Trenton, N.J.) and the GPP500F PLATE PROCESSOR available from Global Asia Ltd. (Hong Kong).

The time for exposure through the mask image will depend upon the nature and thickness of the radiation-sensitive element and the source of the radiation. For example, in one of embodiment, a FLEXCEL-SRH plate precursor available from Eastman Kodak Company (Norwalk, Conn.) may be mounted on a KELLEIGH MODEL 310 PLATEMAKER and back exposed to UV-A radiation through the support for about 20 seconds to prepare a thin, uniform cured layer on the support side of the element. The cover sheet of the radiation sensitive element is then removed from the front side, and the film containing the mask image is then brought into air-free contact with the radiation sensitive element on the front side. The assembly may then be exposed to a UV radiation through the film containing the mask image for about 14 minutes. The mask image information is thus transferred to the flexographic plate precursor.

Relief Image Development

The carrier sheet including the mask, or the carrier sheet without the mask, is then removed, by any appropriate means, such as peeling. The exposed element (or imaged element), is then generally developed with a suitable developer to form a relief image. Development serves to remove the uncured regions of the radiation-sensitive element, leaving the cured regions that define the relief image on the substrate.

Any known developer for the imaged element can be used in this processing step including those containing chlorinated organic solvents. Some useful developers are predominantly non-chlorinated organic solvents. By "predominantly", we mean that more than 50% (by volume) of the developer comprises one or more non-chlorinated organic solvents such as aliphatic hydrocarbons and long chain alcohols (that is alcohols with at least 7 carbon atoms). The remainder of the solutions can be chlorinated organic solvents, but typically, the chlorinated organic solvents comprise less than 50% (by volume) of the developer.

Thus certain useful developers are predominantly what are known as "perchloroethylene alternative solvents" (PAS). These PAS are generally volatile organic compounds typically comprised of mixtures of aliphatic hydrocarbons and long-chain alcohols. They are generally stable under normal room temperature and storage conditions. Examples of such commercially available solvents include but are not limited to, PLATESOLV available from Hydrite Chemical Co. (Brookfield, Wis.), NYLOSOLV® available from BASF (Germany), FLEXOSOL® available from DuPont (Wilmington, Del.), OptiSol® available from DuPont (Wilmington, Del.), and SOLVIT® QD available from MacDermid (Denver, Colo.).

Development is usually carried out under conventional conditions such as for from about 5 to about 20 minutes and at from about 23 to about 32° C. The type of developing apparatus and specific developer that are used will dictate the specific development conditions.

Post-development processing of the relief image may be suitable under some circumstances. Typical post-development processing includes drying the relief image to remove any excess solvent ad post-curing by exposing the relief image to curing radiation to cause further hardening or crosslinking The conditions for these processes are well known to those skilled in the art. For example, the relief image may be blotted or wiped dry, or dried in a forced air or infrared oven. Drying times and temperatures would be apparent to a skilled artisan. Post-curing may be carried out using the same type of radiation previously used to expose through the mask image.

Detackification (or "light finishing") may be used if the relief image surface is still tacky. Such treatments, for example, by treatment with bromide or chlorine solutions or exposure to UV or visible radiation, are well known to a skilled artisan.

The resulting relief image may have a depth of from about 2 to about 40% of the original thickness of the radiation-sensitive element imageable layer. For a flexographic printing plate, the depth of the relief image may be from about 150 to about 500 µm. For a printed circuit board, the imageable layer is completely removed in either the exposed or non-exposed regions, to reveal the metal layer underneath. Thus, in such elements, the depth of the relief image depends upon the thickness of the imageable layer. Advantageously, the relief image has predominantly shoulder angles of greater than 50°.

Development may also be possible by the thermal process as disclosed in U.S. Pat. No. 5,175,072 (Martens), U.S. Pat. No. 5,279,697 (Peterson et al.), and U.S. Pat. No. 6,998,218 (Markhart).

The following examples illustrate the practice of this invention but the invention is not to be limited thereby.

EXAMPLES

The following materials and methods were used in the examples:

AIRVOL® 205 premix solution is a 10% solids aqueous solution of a poly(vinyl alcohol) that can be obtained from Air Products (Allentown, Pa.).

BUTVAR® B-76 is a poly(vinyl butyral) resin that can be obtained from Solutia, Inc. (St. Louis, Mo.).

Byk® 333 is a polyether modified polydimethylsiloxane that can be obtained from Byk Chemie (Wallingford, Conn.).

Curcumin is a yellow dye that can be obtained from Cayman Chemicals (Ann Arbor, Mich.).

Dyneon™ FC 2211 and 2178 are fluoroelastomers that can be obtained from 3M Company (St. Paul, Minn.).

EMAX is a 60:40 copolymer of ethyl methacrylate and methacrylic acid that can be obtained from Eastman Kodak Company (Rochester, N.Y.).

Fluon® AD1 is a PTFE dispersion that can be obtained from Asahi Glass Fluoropolymers USA.

IR Dye A is an IR absorbing dye having the following structure and was obtained from Eastman Kodak Company (Rochester, N.Y.).

MEK represents methyl ethyl ketone.

MIBK represents methyl iso-butyl ketone.

NeoRez 322 polyurethane resin that can be obtained from DSM NeoResins (Wilmington, Mass.).

NeoRez U395 is a polyurethane resin that can be obtained from DSM NeoResins (Wilmington, Mass.).

PCA represents a mixture of 70% (weight) poly(methyl cyanoacrylate) and 30% (weight) poly(ethyl cyanoacrylate) as a 10% total solids solution in 50/50 cyclopentanone/acetone, obtained from Eastman Kodak Company (Rochester, N.Y.).

Sudan Black is a black dye that can be obtained from Aldrich Chemicals Co. (Milwaukee, Wis.).

Surfynol® FS-80 is a wetting agent that can be obtained from Air Products & Chemicals, Inc. (Allentown, Pa.).

UVINUL® 3050 is an ultraviolet radiation absorbing dye that can be obtained from BASF (Germany).

Invention Examples 1 & 2 and Comparative Example 1

Two films of the present invention were prepared in the following manner.

A carrier sheet, formed of a 0.01 cm thick poly(ethylene terephthalate), was coated with the transparent layer formulation comprising Dyneon™ FC 2211 (Invention Example 1) or Dyneon™ FC 2178 (Invention Example 2) out of MEK using a #12 wire rod to provide transparent layer having a dry coverage of 562 mg/m² when dried for 2 minutes at 93° C. This layer has a refractive index at 400 nm of about 1.40 that is less than the refractive index of the carrier sheet, which is (at 400 nm) about 1.65.

Onto this transparent layer was coated a intermediate layer formulation containing Airvol® 205 poly(vinyl alcohol) out of an 80:20 water:n-propanol mixture using a #10 wound-wire coating rod. The resulting coating was dried at 2 minutes at 93° C. to provide a dry coating coverage of about 648 mg/m².

A barrier layer formulation was formed with the components and coating solvents listed in the following TABLE I and applied to the dried intermediate layer using a #10 wound-wire coating rod. The resulting coating was dried at about 93° C. for 2 minutes to form a barrier layer to provide a coating coverage of about 378 mg/m².

TABLE I

| Barrier Layer Formulation Component | Formulation Amount (% solids) |
|---|---|
| PCA | 84 |
| NeoRez U395 | 5 |
| IR Dye A | 11 |
| Acetone | 40 parts |
| Cyclopentanone | 60 parts |

On the dried barrier layer, an imageable layer was formed using the components and coating solvents shown in the following TABLE II using a #20 wound-wire coating rod. The resulting coatings were dried at about 93° C. for 2 minutes to form imageable layers on the barrier layer at a coating coverage of about 1.51 g/m².

TABLE II

| Imageable Layer Formulation Component | Formulation Amount (% solids) |
|---|---|
| Sudan Black | 10 |
| UVINUL ® 3050 | 14.3 |
| Curcumin | 28.7 |
| Nitrocellulose | 16 |
| NeoRez U395 | 8.8 |
| NeoRez U322 | 8.8 |
| IR Dye A | 13.5 |
| MEK | 5 parts |
| Cyclohexanone | 5 parts |
| MIBK | 80 parts |
| Ethanol | 10 parts |

The overcoat was formed using the components and coating solvents shown in the following TABLE III was applied over the dried imageable layer using a #20 wound-wire coating rod. The resulting coatings were dried at about 93° C. for 2 minutes to an overcoat at a coating coverage of about 120 mg/m².

TABLE III

| Overcoat Formulation Component | Formulation Amount (% solids) |
|---|---|
| EMAX | 61.5 |
| Fluon ® AD1 | 10.5 |
| Byk ® 333 | 30 |
| Surfynol ® FS-80 | 10 |
| Airvol ® 205 | 15 |
| NeoRez U322 | 8.8 |
| Water | 80 parts |
| Ethanol | 20 parts |

The resulting films of this invention (Invention Examples 1 and 2) were used to prepare flexographic printing plates in the following manner.

Each film was imaged on a Kodak Trendsetter® 800 Imager (Kodak SQUARESPOT head, 830 nm exposure wavelength) to form a mask image. The mask image was then transferred from the imaged film by laminating it by applying pressure (without heat) to a FLEXEL flexographic printing plate precursor, that did not have a separation layer or antitack layer) available from Eastman Kodak Company (Rochester, N.Y.), so that the interface between the imaged film and precursor was air-free.

The assembly masking film and flexographic printing plate precursor were exposed through the career sheet to curing ultraviolet radiation using a Kelleigh Model 310 Platemaker for 10 minutes and developed using Optisol™ developer (available from Hydrite Chemical Co., LaCrosse, Wis.), followed by normal drying and post curing to provide imaged flexographic printing plates.

Figure 1A:
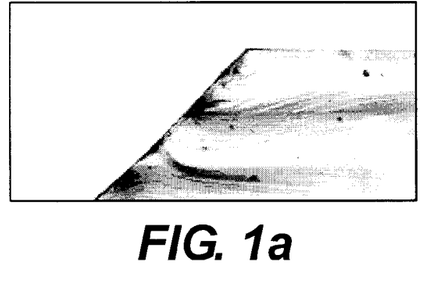
FIG. 1a is a cross-sectional representative schematic view of a solid raised printing area in a relief image having a "steep" shoulder angle, for example that is at least 50°.
Figure 1B:
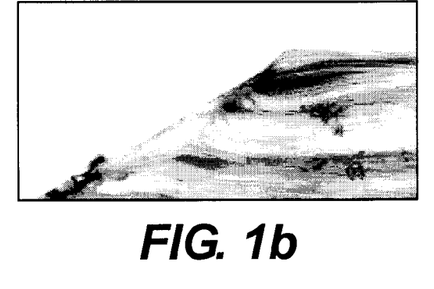
FIG. 1b is a cross-sectional representative schematic view of a solid raised printing area in a relief image having a "shallow" shoulder angle, for example that is less than 50°.
Figure 2:
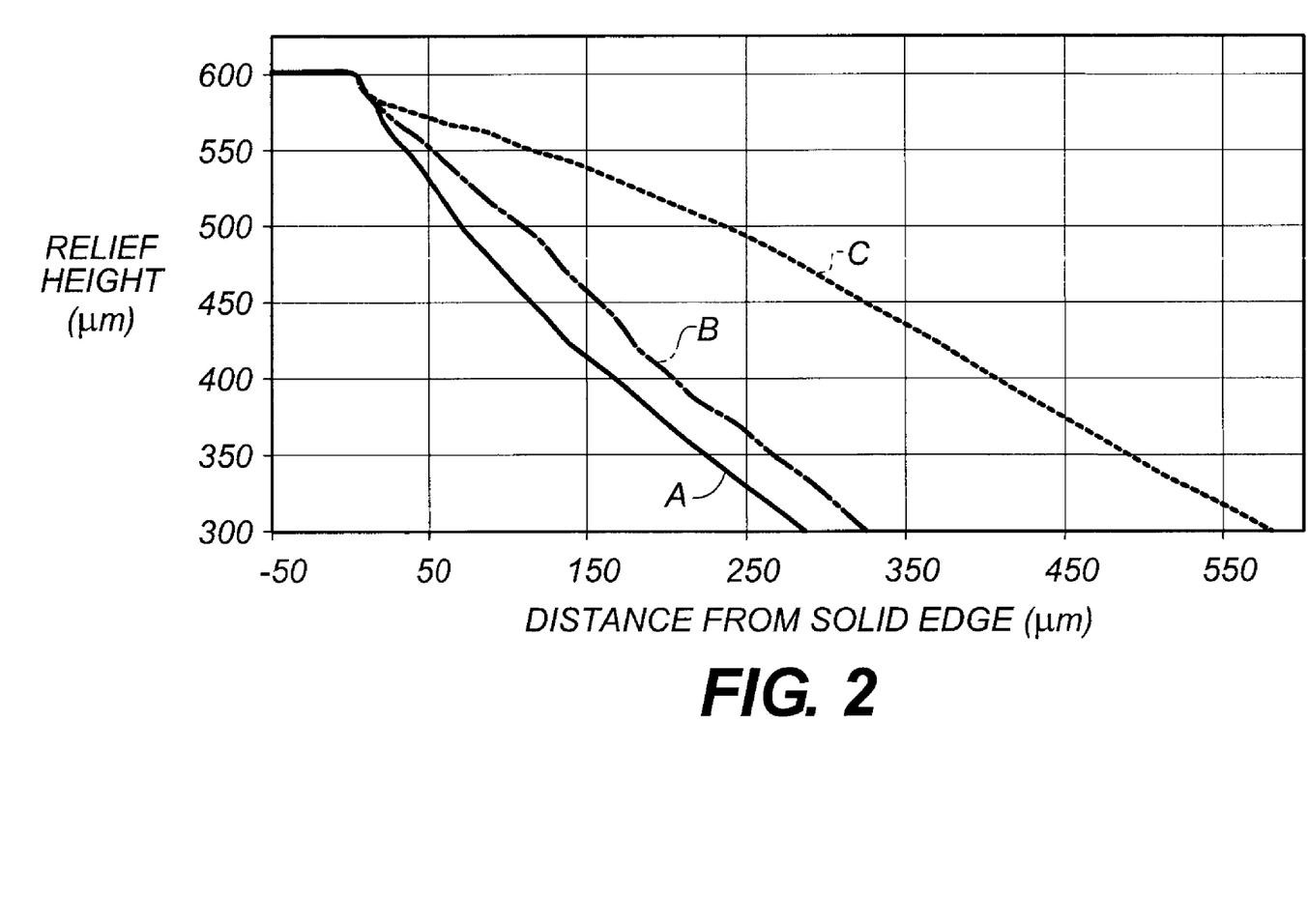
FIG. 2 is a graphical representation of relief height (µm) versus distance from the solid edge (µm) obtained in Invention Examples 1 and 2 and Comparative Example 1.

In Comparative Example 1, a method similar to the above as described for examples 1 and 2, was used to prepare flexographic printing plates using a masking film as in Invention Examples 1 and 2, but that did not have the low refractive index layer FIG. 2 shows the results in the resulting relief images as relief height versus distance from the edge obtained for the three resulting flexographic printing plates prepared for Invention Examples 1 (Curve A) and 2 (Curve B) and Comparative Examples 1 (Curve C).

The results are also provided in the following TABLE IV.

TABLE IV

| Example | Relief Depth (non-imaged areas) (mm) | Main UV Exposure (min) | Dot retention in 1% tints (%) | Depth of 0.40 mm reversed lines (μm) |
|---|---|---|---|---|
| Invention Example 1 | 0.61 | 10 | 98 | 159 |
| Invention Example 2 | 0.63 | 10 | 96 | 178 |
| Comparative Example 1 | 0.64 | 10 | 98 | 58 |

In Invention Examples 1 and 2, the average shoulder angles were 55° while the average shoulder angle in Comparative Example 1 was about 25°.

Figure 3A:
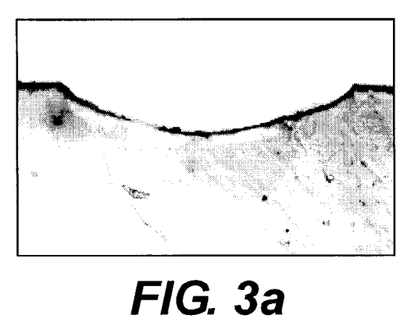
FIGS. 3a and 3b are cross-sectional views of actual micrographic images of relief images provided by Invention Example 1 and Comparative Example 1 described below.
Figure 3B:
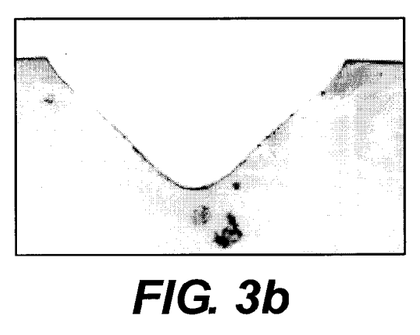

These results can also be seen in FIGS. 3a and 3b showing cross-sections of a 380 μm reversed line in the resulting flexographic printing plates for Comparative Example 1 (FIG. 3a) and Invention Example 1 (FIG. 3b).

Invention Example 3

Transparent layer formulations were prepared using the components shown in the following TABLE V and then used to prepare film samples.

TABLE V

| Formulation Component | Film Sample 1 Formulation (% solids) | Film Sample 2 Formulation (% solids) | Film Sample 3 Formulation (% solids) |
|---|---|---|---|
| Airvol ® 205 polyvinyl alcohol | 90 | 84 | 78 |
| PEG 600 polyethylene glycol | 10 | 10 | 10 |
| NaBF₄ | 0 | 6 | 12 |
| n-Propanol | 20 parts | 20 parts | 20 parts |
| Water | 80 parts | 80 parts | 80 parts |

PEG 600 and NaBF₄ are available from Aldrich Chemical Company.

Each of the film samples above were prepared by coating the transparent layer formulations shown in TABLE V and onto 4 mil (0.01 cm) poly(ethylene terephthalate) support (carrier sheet) using a #26 wound-wire coating rod. The resulting transparent layers were dried at 93° C. for 2 minutes to provide a dry coverage of about 3.5 g/m². Fully functional film constructions were prepared by coating and drying on each of these transparent layers: (i) barrier, (ii) imageable, and (iii) overcoat layers as described for Invention Example 1. After drying, each film was imaged on a Kodak Trendsetter® 800 Imager (Kodak SQUARESPOT head, 830 nm exposure wavelength) to form a mask image. The mask image was then transferred from the imaged film by laminating it by applying pressure (without heat) to a FLEXEL flexographic printing plate precursor (that did not have a separation layer or anti-tack layer) available from Eastman Kodak Company (Rochester, N.Y.), so that the interface between the imaged film and precursor was air-free (that is, optical contact was achieved).

The assembled masking film and flexographic printing plate precursor were exposed through the career sheet to curing ultraviolet radiation using a Kelleigh Model 310 Platemaker for 10 minutes and developed in Optisol™ developer followed by normal drying and post curing to provide imaged flexographic printing plates.

Table VI below lists the refractive index ("RI" at 400 nm) of each transparent layer described above, the calculated critical angle for internal reflection, and the depths ("RLD") of 0.50 mm wide reversed lines in the final printing plates made using the three films (mask image constructions). The UV exposures were all 10 minutes.

TABLE VI

| Sample (Film #) | Relief depth (mm) | Main UV (min.) | Transparent Layer RI | Critical Angle | RLD (µm) |
|---|---|---|---|---|---|
| 1 | 0.77 | 10 | 1.62 | 80° | 78 |
| 2 | 0.77 | 10 | 1.57 | 72° | 100 |
| 3 | 0.77 | 10 | 1.51 | 66° | 126 |

As shown in TABLE VI, there is a strong relationship between the refractive index (RI) of the transparent layer and the depth of 500 micron (µm) reversed lines in the finished plates. This relationship is (in this specific case and over this range of RI values:

$$RLD = 785 - 436 \times (RI) \ R^2 \text{ or } (R)^2 = 100\%$$

The invention has been described in detail with particular reference to certain preferred embodiments thereof, but it will be understood that variations and modifications can be effected within the spirit and scope of the invention.

The invention claimed is:

1. A method of making a relief image, the method comprising:
  A) forming a mask image by forming exposed and non-exposed regions in an imaged film, which film prior to imaging, comprises:
    a transparent carrier sheet having thereon at least one non-silver halide thermally sensitive imageable layer and a UV-absorbing colorant disposed in the imageable layer,
    an infrared radiation absorbing compound dispersed in a polymeric binder, and
    a transparent layer disposed between the carrier sheet and the imageable layer, which transparent layer has a thickness of from about 0.4 µm to about 10 µm and a refractive index that is at least 0.08 lower than the refractive index of the carrier sheet or lower than the refractive index of any optional immediately adjacent layer between the carrier sheet and the transparent layer,
  B) transferring the mask image in the imaged film to a radiation-sensitive element while there is complete optical contact between the mask image and the radiation-sensitive element,
  C) exposing the radiation-sensitive element to curing radiation through the mask image while in complete optical contact with the radiation-sensitive element, to form an imaged element, wherein the mask image is opaque to the curing radiation, and
  D) developing the imaged element to form a relief image having an average shoulder angle of at least 50°.

2. The method of claim 1 wherein the imaged film is removed from complete optical contact with the exposed radiation-sensitive element between steps C and D.

3. The method of claim 1 wherein the carrier sheet and transparent layer are removed from complete optical contact with the imaged film between steps C and D.

4. The method of claim 1 wherein the radiation-sensitive element is a UV-sensitive element that is exposed to UV radiation through the mask image to form an imaged element, wherein the mask image is opaque to UV radiation.

5. The method of claim 1 wherein the radiation-sensitive element is a flexographic printing plate precursor and the imaged element is a flexographic printing plate.

6. The method of claim 1 wherein the transferring step B is carried out by lamination.

7. The method of claim 1 wherein the transferring step B is carried out by applying a radiation-sensitive layer while in liquid form, to the imaged film, and then forming the radiation-sensitive element.

8. The method of claim 1 wherein the transparent layer comprises a fluoroelastomer and optionally an adhesion promoter.

9. The method of claim 1 wherein the film further comprises an intermediate layer between the imageable layer and the transparent layer, which intermediate layer has a thickness of from about 0.1 to about 10 µm.

10. The method of claim 9 wherein the intermediate layer comprises a poly(vinyl alcohol), poly(vinyl butyral), a cellulosic polymer, or hydrolyzed styrene maleic anhydride polymer.

11. The method of claim 1 wherein the film further comprises a barrier layer disposed between the imageable layer and the carrier sheet, the barrier layer comprising a heat-combustible polymer binder and an infrared radiation absorbing compound, which heat-combustible polymer binder is a poly(cyanoacrylate) or nitrocellulose.

12. The method of claim 1 wherein the film comprises a carrier sheet having thereon, in order:
  a) a transparent layer comprising a fluoroelastomer, the transparent layer optionally including an adhesion promoter, and the transparent layer having a refractive index of at least 0.08 lower than the refractive index of the carrier sheet,
  b) an intermediate layer comprising a poly(vinyl alcohol), cellulosic polymer, poly(vinyl butyral), hydrolyzed styrene maleic anhydride polymer, or a thermally resistant polymer, and having a thickness of from about 0.1 to about 10 µm, the intermediate layer optionally including a crosslinking agent, coating aid, surfactant, or release-enhancing agent,
  c) a barrier layer comprising a poly(cyanoacrylate) or nitrocellulose, and an infrared radiation absorbing dye, and optionally metal oxide particles or crosslinking agents,
  d) a imageable layer comprising an infrared radiation absorbing dye and a UV-absorbing colorant dispersed in a polyurethane, poly(vinyl butyral), acrylamide polymer, nitrocellulose, or polyacetal binder, and e) an overcoat comprising a methacrylic acid copolymer and fluoropolymer particles.

13. The method of claim 12 wherein the barrier layer includes an infrared radiation absorbing compound.

14. The method of claim 12 wherein the infrared radiation absorbing compound in the imageable layer is an IR dye.

15. The method of claim 12 wherein the carrier sheet is a polyester, fluorine polyester polymer, polyethylene polypropylene, polybutadiene, polycarbonate, polyacrylate, polyvinyl chloride or copolymer thereof, or hydrolyzed or non-hydrolyzed cellulose acetate, and is from about 20 to about 200 µm thick, and optionally includes an adhesion promoter.

16. The method of claim 12 wherein the intermediate layer further comprises an adhesion promoter.

* * * * *